(12) United States Patent
Leon-Salas

(10) Patent No.: US 12,683,690 B2
(45) Date of Patent: Jul. 14, 2026

(54) SYSTEM AND METHOD FOR SOLAR CELL PHOTO-LUMINESCENCE MODULATION

(71) Applicant: Purdue Research Foundation, West Lafayette, IN (US)

(72) Inventor: Walter Daniel Leon-Salas, West Lafayette, IN (US)

(73) Assignee: PURDUE RESEARCH FOUNDATION, West Lafayette, IN (US)

( * ) Notice: Subject to any disclaimer, the term of this patent is extended or adjusted under 35 U.S.C. 154(b) by 181 days.

(21) Appl. No.: 18/596,455

(22) Filed: Mar. 5, 2024

(65) Prior Publication Data

US 2024/0297718 A1    Sep. 5, 2024

Related U.S. Application Data

(60) Provisional application No. 63/450,052, filed on Mar. 5, 2023.

(51) Int. Cl.
| | |
|---|---|
| *H04B 10/00* | (2013.01) |
| *H02J 7/35* | (2006.01) |
| *H04B 10/54* | (2013.01) |
| *H10F 10/144* | (2025.01) |
| *H02J 101/24* | (2026.01) |

(52) U.S. Cl.
CPC .............. *H04B 10/541* (2013.01); *H02J 7/35* (2013.01); *H10F 10/144* (2025.01); *H02J 2101/24* (2026.01)

(58) Field of Classification Search
CPC .............. H04B 10/541; H04B 10/1123; H04B 10/1143; H04B 10/1149; H04B 10/806;
H04B 10/807; H04B 10/808; H04B 10/116; H04B 10/40; H04B 10/548; H04B 10/516; H02J 7/35; H01F 10/144
USPC ....... 398/171, 183, 186, 187, 188, 189, 135, 398/136, 127, 128, 129, 130, 158, 159, 398/118, 119, 33, 38; 323/271, 285, 282, 323/284
See application file for complete search history.

(56) References Cited

U.S. PATENT DOCUMENTS

| | | | | |
|---|---|---|---|---|
| 9,941,748 | B2 * | 4/2018 | Lucrecio | H04B 10/807 |
| 10,715,252 | B2 * | 7/2020 | Leon-Salas | H04B 10/1141 |
| 11,196,487 | B1 * | 12/2021 | Fujita | H04B 10/1143 |

OTHER PUBLICATIONS

Fakidis, J. et al., "On the design of an optical wireless link for small cell backhaul communication and energy harvesting," IEEE 25th Annual International Symposium on Personal, Indoor and Mobile Radio Communication (PIMRC), (Sep. 2014).
Wang, Z. et al., "Towards self-powered solar panel receiver for optical wireless communications," IEEE International Conference on Communications (ICC), (Jun. 2014).

(Continued)

*Primary Examiner* — Hanh Phan
(74) *Attorney, Agent, or Firm* — Purdue Research Foundation

(57) ABSTRACT

A system may include a solar cell and a modulator connected to an output of the solar cell. The system may receive a signal. When the signal being in a first state corresponding to modulation, the modulator may modulate voltage output of the solar cell and cause the solar cell to perform optical transmission. When the signal is in a second state corresponding to energy harvesting, the modulator to cease modulation of the output of the solar cell.

7 Claims, 13 Drawing Sheets

(56)                References Cited

OTHER PUBLICATIONS

Wang, Z. et al., "On the design of a solar-panel receiver for optical wireless communications with simultaneous energy harvesting," IEEE Journal on Selected Areas in Communications, vol. 33, No. 8, pp. 1612-1623, (Aug. 2015); date of publication Jan. 14, 2015.

Chen, H.-Y. et al., "Passive optical receiver for visible light communication (VLC)," IEEE Region 10 Annual International Conference, Proceedings/TENCON, vol. 2016-, p. 1-2, Article 7372787, (Nov. 2015).

Zhang, S., et al., "Organic solar cells as high-speed data detectors for visible light communications," Optica, vol. 2, No. 7, pp. 607-610, (Jul. 2015); published Jun. 29, 2015.

Bialic, E. et al., "Specific innovative semi-transparent solar cell for indoor and outdoor LiFi applications," Applied Optics, vol. 54, No. 27, pp. 8062-8069, (2015); published Sep. 14, 2015.

Li, J. et al., "Retro-VLC: enabling battery-free duplex visible light communication for mobile and IoT applications," HotMobile 2015—16th International Workshop on Mobile Computing Systems and Applications (2015), pp. 21-26, Feb. 2015.

Lee, S.-H., "A passive transponder for visible light identification using a solar cell," IEEE Sensors Journal, vol. 15, No. 10, pp. 5398-5403, (Oct. 2015); date of publication Jun. 3, 2015.

Malik, B. et al., "Solar panel receiver system implementation for visible light communication," IEEE International Conference of Electronics, Circuits and Systems (ICECS), p. 502-503, (Dec. 2015).

Sarwar, R. et al., "Visible light communication using a solar-panel receiver," 2017 16th IEEE International Conference on Optical Communications and Networks (ICOCN), (Aug. 2017).

Fan, X. et al., "A circuit for simultaneous optical data reception and energy harvesting," 2017 IEEE 60th International Midwest Symposium on Circuits and Systems (MWSCAS), p. 831-834, (2017).

Wang, Y. et al., "Spectrum effect on output characteristics of wireless energy and data hybrid transmission system using a solar panel," Tenth International Conference on Information Optics and Photonics (CIOP), (2018).

Leon-Salas, W. D. et al., "Exploiting luminescence emissions of solar cells for Optical Frequency Identification (OFID)," IEEE Interna-tional Symposium on Circuits and Systems (ISCAS), (May 2018).

Leon-Salas, W. D. et al., "Solar cell photo-luminescence modulation for Optical Frequency Identification Devices," IEEE Transactions on Circuits and Systems-I: Regular Papers, vol. 66, No. 5, pp. 1981-1992, (May 2019); date of publication Sep. 19, 2018.

Leon-Salas, W. D. et al., "Photo-luminescence modulation circuits for solar cell based optical communications," 2019 IEEE International Symposium on Circuits and Systems (ISCAS), vol. 2019, pp. 1-5, 2019, Article 8702596 (2019).

Rau, U., "Superposition and reciprocity in the electroluminescence and photoluminescence of solar cells," IEEE Journal of Photovoltaics, vol. 2, No. 2, pp. 169-182, (Apr. 2012); date of publication Jan. 6, 2012.

Miller, O. D. et al., "Strong internal and external luminescence as solar cells approach the Schockley-Queisser limit," IEEE Journal of Photovoltaics, vol. 2, No. 3, pp. 303-311, (Jul. 2012).

Green, M. et al., "Solar cell efficiency tables (version 57)," Progress in Photovoltaics Res Appl., vol. 29, No. 1, pp. 3-15, (2021).

Rincón-Mora, G. A., "Harvesting microelectronic circuits," Chapter 10 in Energy Harvesting Technologies, authors D. J. Inman and p. Shashan, Eds. New York, NY, USA: Springer-Verlag, (2009), pp. 287-321.

Kadri, R. et al., "Modeling of the photovoltaic cell circuit parameters for optimum connection model and real-time emulator with partial shadow conditions," Energy, vol. 42, pp. 57-67, (2012); available online Nov. 8, 2011.

Kumar, R. A. et al., "Time domain technique to measure solar cell capacitance," Review of Scientific Instruments, vol. 74, No. 7, pp. 3516-3519, (Jul. 2003).

Texas Instruments product literature for TLV2761 Single, 3.6-V, 500-KHz, RRIO Operational Amplifier and Data Sheet: TLV2760, TLV2761, TLV2763, TLV2764, TLV2765 Family of 1.8 V Micropower Rail-to-Rail Input/Output Operational Amplifiers with Shutdown; SLOS326F—Jun. 2000, revised Aug. 2013. Available: https://www.ti.com/product/TLV2761. [Accessed: Dec. 8, 2021].

Ghassemlooy, Z. et al., "Digital pulse interval modulation for optical communications," IEEE Communications Magazine, vol. 36, No. 12, pp. 95-99, (Dec. 1998).

* cited by examiner

SYSTEM AND METHOD FOR SOLAR CELL PHOTO-LUMINESCENCE MODULATION

CROSS REFERENCE TO RELATED APPLICATIONS

This application claims the benefit of U.S. Provisional Application No. 63/450,052 filed Mar. 5, 2023. the entirety of which is hereby incorporated by reference.

GOVERNMENT RIGHTS

This invention was made with government support under ECCS-1809637 awarded by the National Science Foundation. The government has certain rights in the invention.

TECHNICAL FIELD

This disclosure relates to optical communications and, in particular, to photo-luminescent radiation of solar cells.

BACKGROUND

The use of solar cells as photo-receptors in receivers for visible light communications allows using a solar cell for multiple purposes, namely to harvest ambient radiant energy and to receive data wirelessly, savings in costs and space will be achieved, which would be advantageous for Internet-of-Things (IoT) applications. This approach was further extended to use GaAs solar cells as light emitters for data transmission. In this technique, dubbed Optical Frequency Identification (OFID), the electro-luminescent (EL) and photo-luminescent (PL) radiation of GaAs solar cells is modulated to transmit information wirelessly. Due to their direct bandgap electronic structure, GaAs solar cells have strong EL and PL emissions in the near infrared (NIR), peaking around 860 nm, which can be detected using a Si photo-diode or a CMOS camera.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

DETAILED DESCRIPTION

Figure 1:
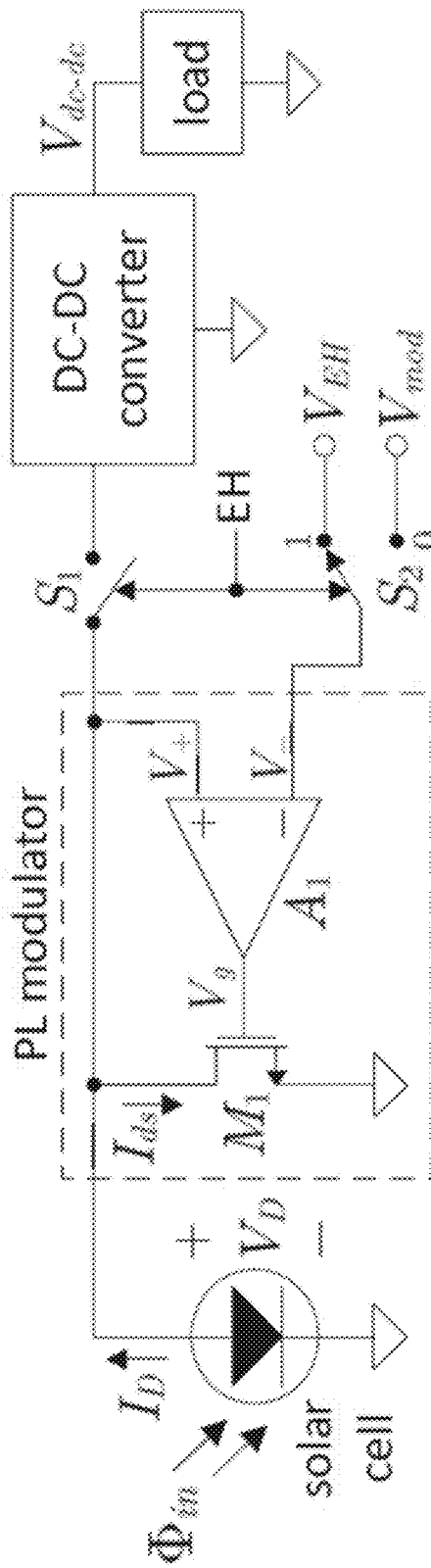
FIG. 1 illustrates a system for modulating PL transmission from a solar cell.

The use of solar cells as photo-receptors in receivers for visible light communications has been explored before. The motivation for this approach is that by using a solar cell for two purposes, namely to harvest ambient radiant energy and to receive data wirelessly, savings in costs and space will be achieved, which would be advantageous for Internet-of-Things (IoT) applications. This approach was further extended to use GaAs solar cells as light emitters for data transmission. In this technique, dubbed Optical Frequency Identification (OFID), the electro-luminescent (EL) and photo-luminescent (PL) radiation of GaAs solar cells is modulated to transmit information wirelessly. Due to their direct bandgap electronic structure, GaAs solar cells have strong EL and PL emissions in the near infrared (NIR), peaking around 860 nm, which can be detected using a Si photo-diode or a CMOS camera. In order to modulate the luminescence of a solar cell, it is necessary to vary the voltage across its terminals because the luminescent optical power emitted by a solar cell is a function of its voltage.

The basic PL modulator is a MOSFET that works as a switch to short the terminals of the solar cell or leave them in open circuit (OC), thus, setting the cell's voltage to either 0 V or to the OC voltage ($V_{oc}$). While simple to implement, this type of on-off modulator fully discharges the solar cell's internal capacitance while it is being shorted. This capacitance needs to be re-charged before the next symbol can be transmitted. The time to re-charge this internal capacitance is a function of the luminous flux failing on the solar cell and the area of the solar cell.

An improved PL modulator that exploits the relationship between the input impedance of a boost DC-DC converter and the duty cycle of its clock input was employed to change the voltage across the solar cell and modulate the solar cell's PL. This approach allows the existence of modulation levels between short and OC voltages, thus, it is possible to use it with Mary modulation and also to avoid fully shorting the solar cell. However, due to the large input capacitance of a boost DC-DC converter, the modulation speed of this modulator is limited to few kilobits per second (kbps). Moreover, the switching action of the DC-DC converter introduces ripple noise, which would be of concern for M-ary modulation.

This paper presents a circuit suitable for the modulation of the PL radiation of GaAs solar cells. The circuit uses a MOSFET and a low-power operational amplifier (opamp) in a feedback loop and works as a variable load to the solar cell. By controlling the current drawn from the solar cell, the proposed modulator is able to set the solar cell's voltage to a target value between 0 V and $V_{oc}$. This circuit allows M-ary modulation and does not require a full discharge of the solar cell's internal capacitance. Hence, it can achieve higher speeds than an on-off modulator. Moreover, it does not introduce ripple noise.

FIG. 1 illustrates a system for modulating PL transmission from a solar cell. This system can set the voltage across the solar cell to any value between 0 V and $V_{oc}$ using the feedback loop formed by a MOSET ($M_1$) and an opamp ($A_1$) connected together. The modulator may connect to a DC-DC converter. The system may include a modulation switch ($S_1$) and a load switch ($S_2$), which is driven by an input signal (EH). When EH is high (energy harvesting mode), the switch $S_1$ closes and the solar cell gets connected to the DC-DC converter allowing power to be drawn from the solar cell and get transferred to a load. Moreover, during energy harvesting mode, $S_2$ connects the negative input terminal of the opamp ($V_-$) to $V_{EH}$, which is a voltage greater than $V_{oc}$. This causes the opamp's output to drop to 0 V turning off $M_1$. With $M_1$ off, all of the solar cell's output current flows into the DC-DC converter and maximum power from the solar cell can be harvested. $V_{EH}$ can be connected to the output of a boost DC-DC converter.

When the signal EH is low (modulation mode), $S_1$ opens disconnecting the modulator from the DC-DC converter while $V_-$ gets connected to the modulation input $V_{mod}$. The feedback loop forces $V_D$ to follow $V_{mod}$ by controlling $M_1$'s drain to-source current $I_{ds}$. In this manner, $M_1$ effectively appears as a variable load to the solar cell. Since in this mode the modulator is fully disconnected from the DC-DC converter, switching noise from the DC-DC converter does not affect modulation. However, energy cannot be harvested during this mode. Thus, this modulator is suitable for burst transmission.

Figure 2:
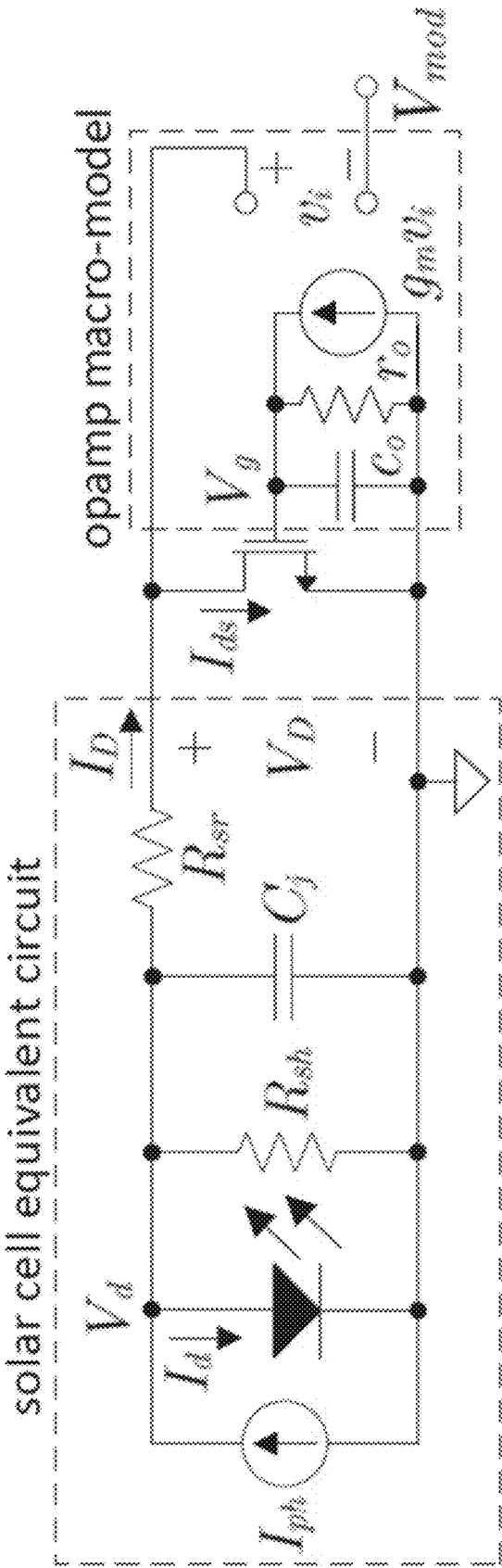
FIG. 2 illustrate an equivalent circuit for a system for modulating PL transmission from a solar cell.
Figure 3:
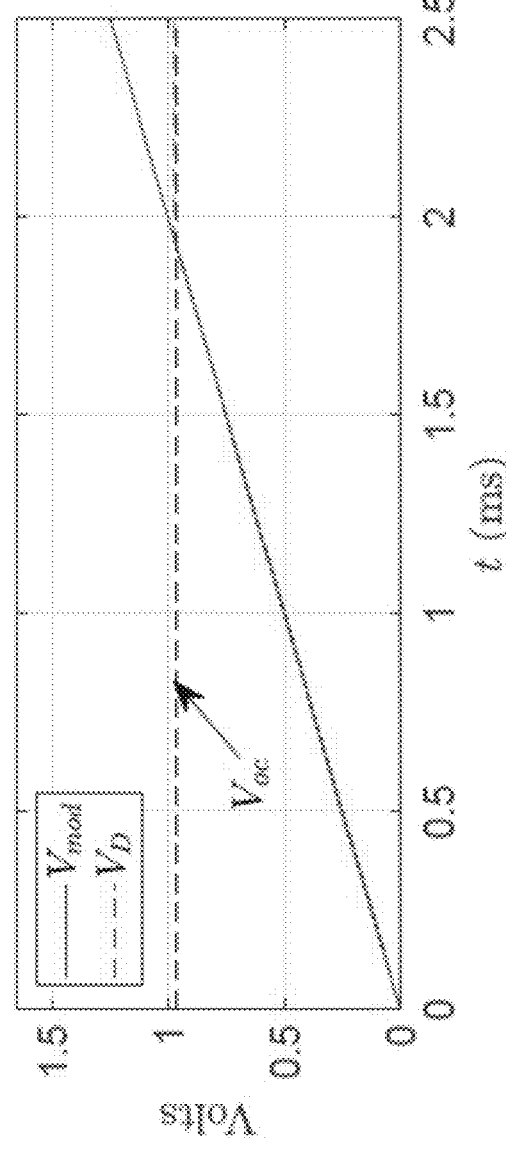
FIG. 3 illustrates a numerical solution of a modulator circuit.

FIG. 2 illustrate an equivalent circuit for the system. In order to verify the operation of this feedback loop, the equivalent circuits of the modulator and the solar cell shown in FIG. 2 were used to analyze the modulator. The following equations were derived from this circuit:

$$\frac{dV_g}{dt} = \left(\frac{A_o}{r_o c_o}\right)(V_D - V_{mod}) - \left(\frac{1}{r_o c_o}\right)V_g \quad (1)$$

$$\frac{dV_D}{dt} = \frac{(I_{ph} + I_s)}{C_j} - \left(\frac{I_s}{C_j}\right)e^{\frac{V_D}{nV_T}} - \left(\frac{1}{R_{sh}C_j}\right)V_D - \left(\frac{I_{ds}}{C_j}\right)$$

where, $r_o c_o = A_o/(2\pi \times GB)$, $g_m = A_o/r_o$, $A_o$ is the opamp's DC gain and GB is its gain-bandwidth product. Three regions of operation for $M_1$ were considered (sub-threshold, saturation and triode). Thus, $I_{ds}$ was modeled as follows:

$$I_{ds} = \begin{cases} I_o * \left(\frac{W}{L}\right) * e^{\frac{V_g - V_{TH}}{nV_T}} & \text{if } V_g < V_{TH} \\ \left(\frac{\beta}{2}\right) * (V_g - V_{TH})^2 & \text{if } V_D \geq V_g - V_{TH} \\ \beta * \left((V_g - V_{TH})V_D - \frac{V_D^2}{2}\right) & \text{if } V_D < V_g - V_{TH} \end{cases} \quad (2)$$

where, $V_{TH}$ is the threshold voltage of the transistor, W/L its width-length ratio and $\beta$ its transconductance. The set of equations was solved numerically. FIG. 3 shows the solution for $V_D$ as $V_{mod}$ increases linearly for the following parameter values: $V_{TH}=0.85$ V, GB=500 kHz, Ao=90 dB, $\beta=0.48$ S, W/L=10,000 and Io=10 nA. Notably, $V_D$ follows $V_{mod}$ until it reaches $V_{oc}$. As $V_{mod}$ increases beyond $V_{oc}$, $V_g$ goes to 0 V and $M_1$ is turned off, leaving the solar cell in OC.

Figure 4:
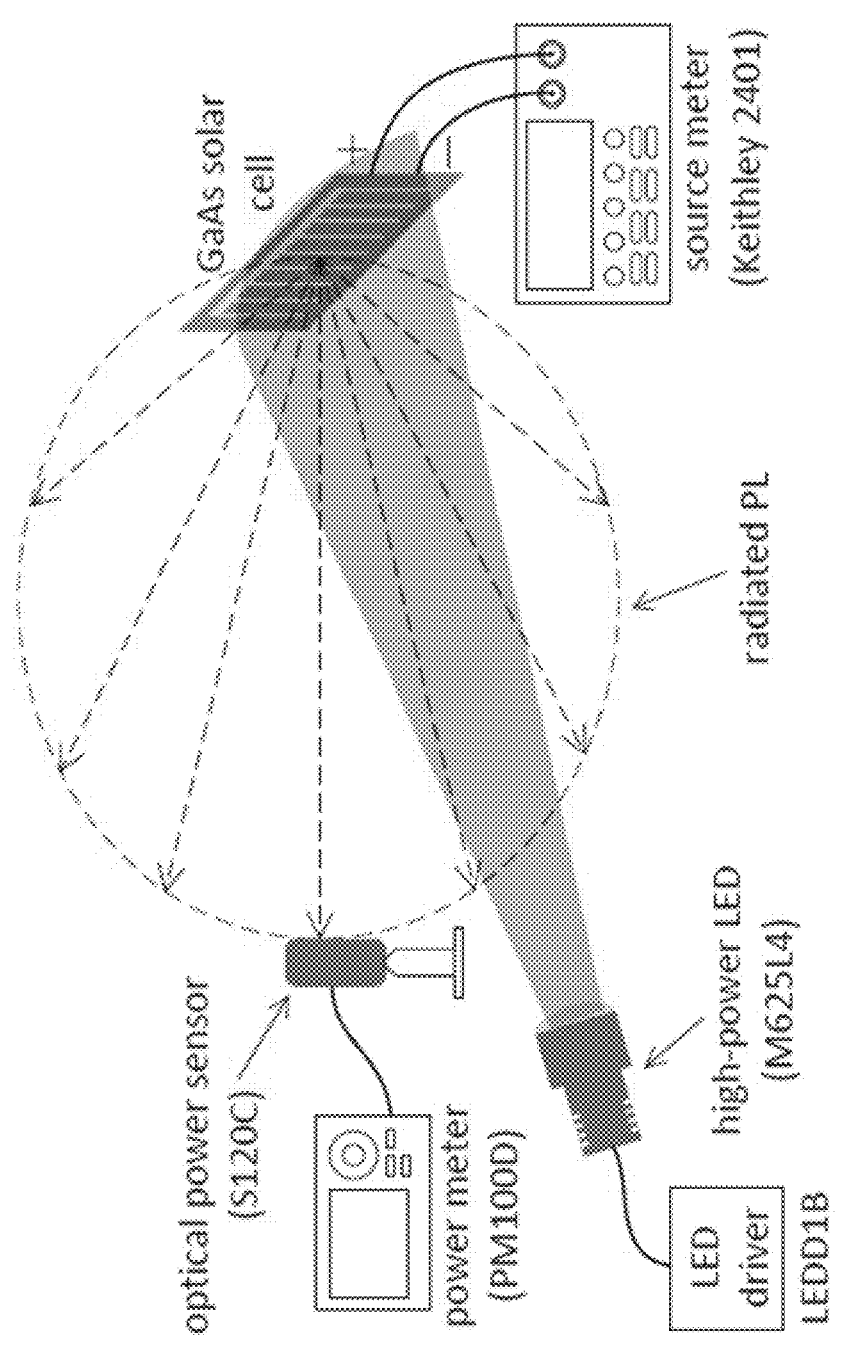
FIG. 4 illustrates an experimental setup to characterize PL irradiance from a GaAs solar cell.

FIG. 4 illustrates an experimental setup to characterize PL radiated by a solar cell. The luminescent radiation emitted by a solar cell is the product of radiative recombination of electron-hole pairs inside the solar cell. For GaAs, which has a bandgap energy of 1.42 eV, the emitted luminescent photons are in the near infrared (NIR) band (peaking at wavelength of approximately 873 nm). For an ideal solar cell (without losses), the emitted luminescence should exactly balance the incoming light. A counter-intuitive result is that efficient external luminescence is a necessary condition for approaching the Shockley-Queisser limit. Thus, a good solar cell also needs to be designed to be a good light emitting diode (LED). It has also been shown that a reflective back contact improves the external luminescence of a solar cell [17]

If the solar cell is kept in OC, energetic electrons in the conduction band must remain inside the cell. Eventually most of these electrons recombine radiatively emitting photons. Thus, in OC the radiated PL is at its maximum and, for efficient GaAs solar cells, it can be readily detected with a CMOS camera. If a short circuit (SC) is applied to the solar cell, the majority of the electrons inside the cell leave and flow through the external circuit. In this case, the PL radiated by the solar cell is greatly reduced since only a small fraction of the photo-generated electrons remain in the solar cell and are available for radiative recombination.

An experimental setup depicted in FIG. 4 was built to characterize the PL radiated by a solar cell. A GaAs solar cell from Alta Devices was employed in this work. These solar cells have a record efficiency of 29% achieved with the help of a reflective back contact, which enhances photon recycling. A high-power LED with an spectrum peaking at 625 nm was used to illuminate the solar cell in order to stimulate a PL response. The solar cell was illuminated with an irradiance of 1.99 $\mu W/cm^2$. The PL irradiance, $E_{pl}$, was measured using an optical power sensor at a distance of 30 cm from the solar cell as the voltage across the solar cell was varied from 0 V to the OC voltage ($V_{oc}=0.964$ V). The voltage across the solar cell was varied in discrete increments using a source meter. A long pass optical filter with a cutoff wavelength of 800 nm was placed in front of the optical power sensor to block light from the LED. In order to obtain repeatable results, this setup was placed inside an enclosure to block ambient light.

Using the reciprocity relation, it can be shown that the luminescent optical power emitted by the solar cell is an exponential function of the voltage across the solar cell $V_D$. Hence, $E_{pl}$, can be modeled as follows:

$$E_{pl} = E_o + E_s * \left(e^{\frac{V_D}{nV_T}} - 1\right) \quad (3)$$

where, $E_o$, $E_s$ and n are model parameters. In particular, $E_o$ is the SC irradiance, n is an ideality factor and VT is the thermal voltage. The values of the model parameters can be estimated by curve fitting (3) to measured data.

Figure 5:
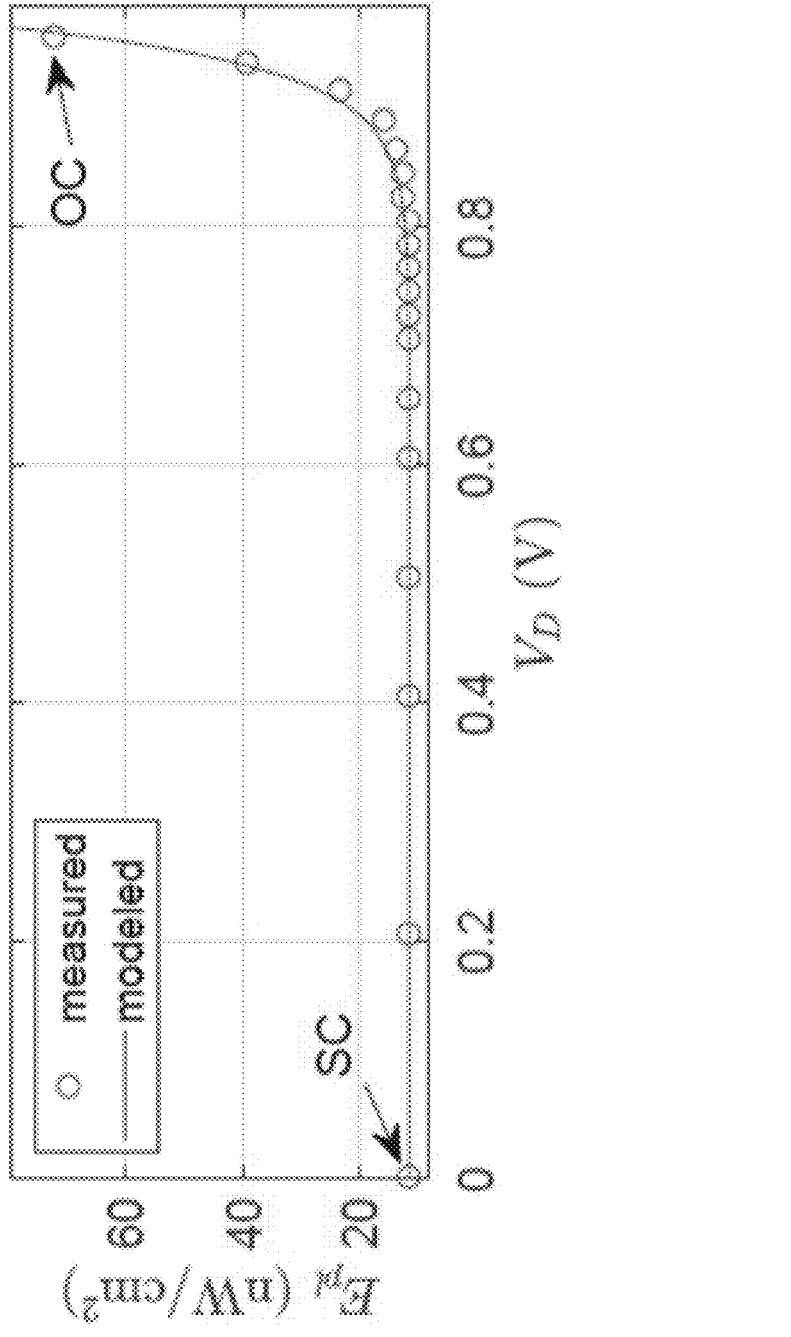
FIG. 5 illustrates a characterization of PL irradiance from a GaAs solar cell.

FIG. 5 illustrates the measured and modeled irradiance from the solar cell. The values of the estimated model parameters are: $E_0=1.17\times10^{-8}$ W/cm$^2$, $E_s=2.90\times10^{-19}$ W/cm$^2$ and n=1.375. In the figure, the SC and OC points are marked. Notably, the PL irradiance is an exponential function of the voltage across the solar cell $V_D$.

This result shows that in order to modulate the emitted PL irradiance, one must vary $V_D$. The most basic modulator is an on-off modulator implemented using a switch. The switch used to short the terminals of the solar cell ($V_D=0$ V) or leave them in OC ($V_D=V_{oc}$). Although simple, the drawback of this modulator is that, during SC, it fully discharges the solar cell's internal capacitance. Recharging this capacitance takes some time and results in a delayed PL response, which ultimately limits the maximum modulation rate.

Figure 6:
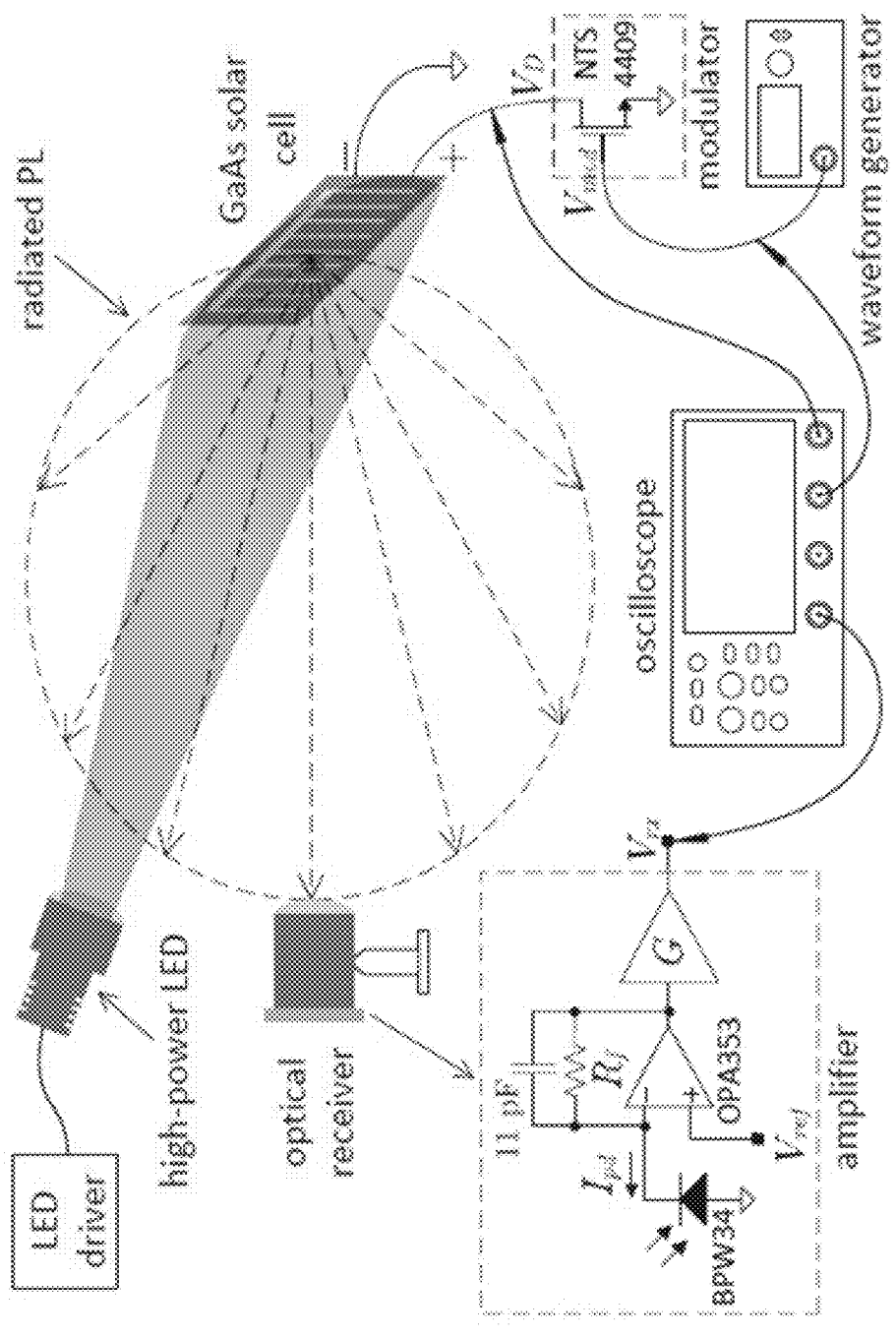
FIG. 6 illustrates an experimental setup to characterize modulation speed of an on-off modulator.

FIG. 6 illustrates an experimental setup to characterize the modulation speed of an on-off modulator. To characterize the charging time of the solar cell's internal capacitance, the setup shown in FIG. 6 was built. The solar cell was illuminated using the same conditions employed in the characterization shown in FIG. 4. An optical receiver was placed in front of the solar cell at a distance of 30 cm and the on-off modulator was implemented using a MOSFET to periodically short the terminals of the solar cell. The optical receiver comprised a focusing lens, a photo-diode and an amplifier.

Figure 7:
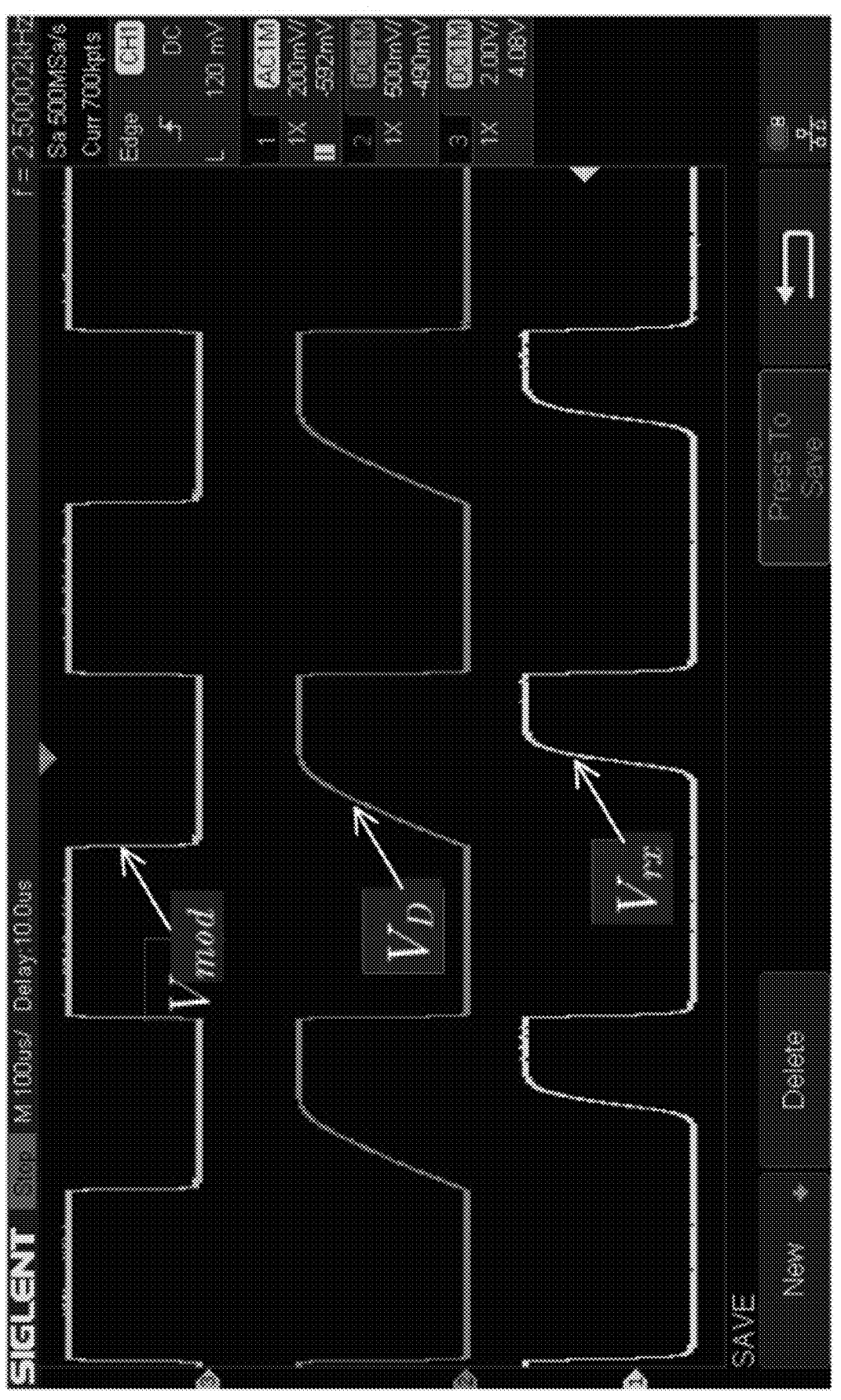
FIG. 7 illustrates acquired waveforms for an on-off modulator.

FIG. 7 illustrates acquired waveforms from the on-off modulator. $V_{mod}$ drives the MOSFET's gate, $V_D$ is the voltage across the solar cell, and $V_{rx}$ is the optical receiver's output. When $V_{mod}$ is high, the MOSFET turns on and shorts the terminals of the solar cell, as a consequence $V_D$ collapses to 0 V. When $V_{mod}$ is low, the MOSFET turns off and $V_D$ raises up to $V_{oc}$ as the solar cell's internal capacitance gets re-charged by the cell's photo-generated current. It can be seen that it takes about 0.1 ms for this re-charging to complete (under the conditions stated above). Moreover, due to the non-linear relationship between $E_{pl}$ and $V_D$, $V_{rx}$ does not change until $V_D$ is sufficiently high. Due to these factors the maximum transmission speed that can be achieved with the on-off modulator is limited to about 5 kbps (when pulse position modulation is used).

Figure 8:
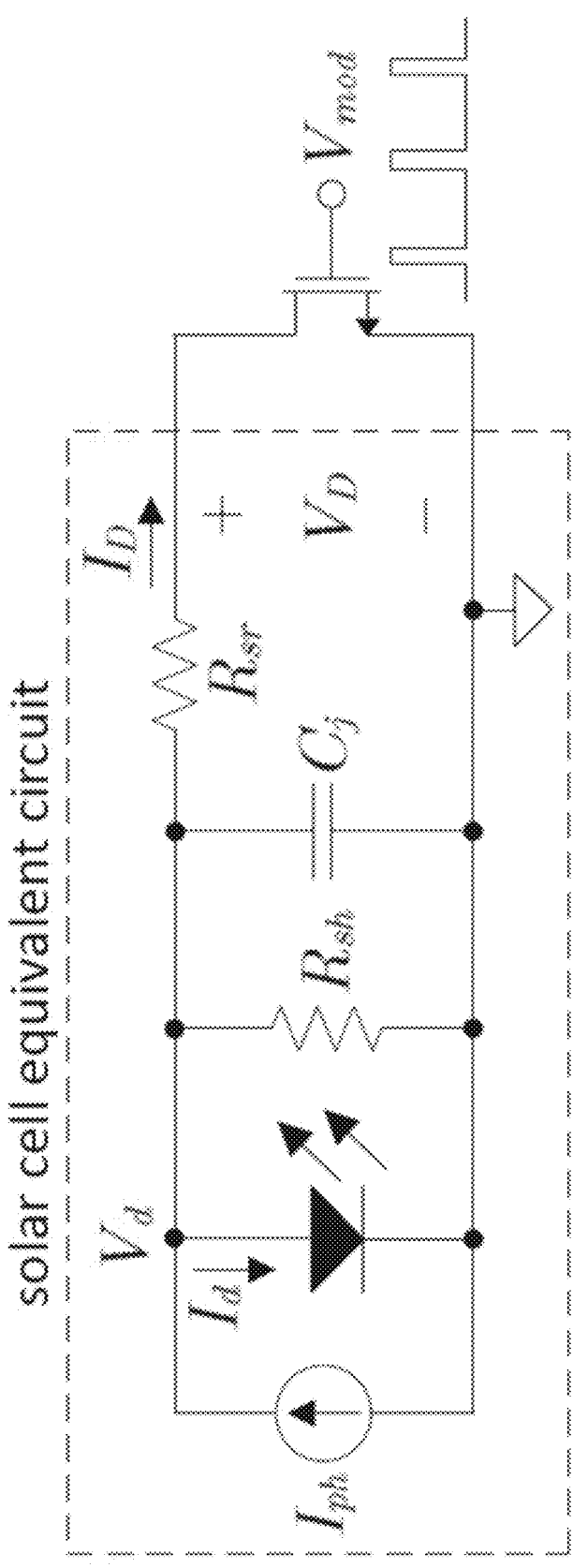
FIG. 8 illustrates an equivalent circuit for the analysis of an on-off PL modulator.

To gain insight into the limiting factors of the on-off modulator, a circuit analysis was performed. FIG. 8 illustrates an equivalent circuit of an on-off PL modulator. In this equivalent circuit, $I_{ph}$ is the photo-generated current, $R_{sh}$ is the shunt resistance that models the load presented to the current generated near the edges of the solar cell, $C_j$ is the junction capacitance and $R_{sr}$ is the series resistance due to device contacts and connections. The diode models the behaviour of the solar cell's pn junction. In our case, this diode is also an LED responsible for the NIR luminescent radiation. The current through this diode is given by Shockley's equation: $I_d = I_s(e^{Vd/nvT} - 1)$, where $I_s$ is the solar cell's reverse saturation current.

Using the circuit in FIG. 8 and considering that $R_{sr} \approx 0$, which results in $V_d \approx V_D$, the differential equation in (4) was derived and solved using numerical methods.

$$\frac{dV_D}{dt} = \frac{I_{ph} + I_s}{C_j} - \left(\frac{I_s}{C_j}\right)e^{\frac{V_D}{nV_T}} - \left(\frac{1}{R_{sh}C_j}\right)V_D \quad (4)$$

Figure 9:
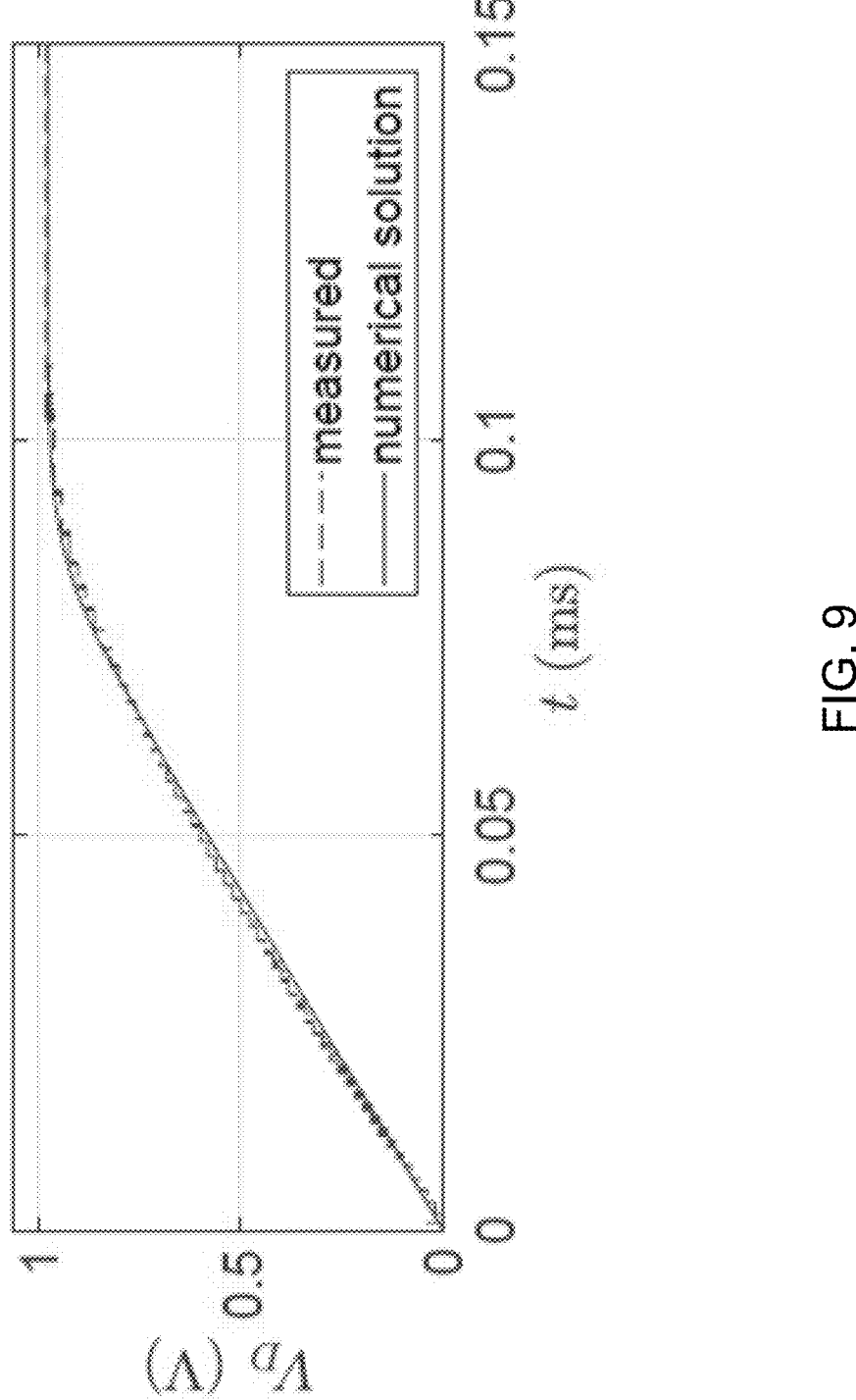
FIG. 9 illustrates measured and calculated voltage across a solar cell after it has been short circuited.
Figure 10:
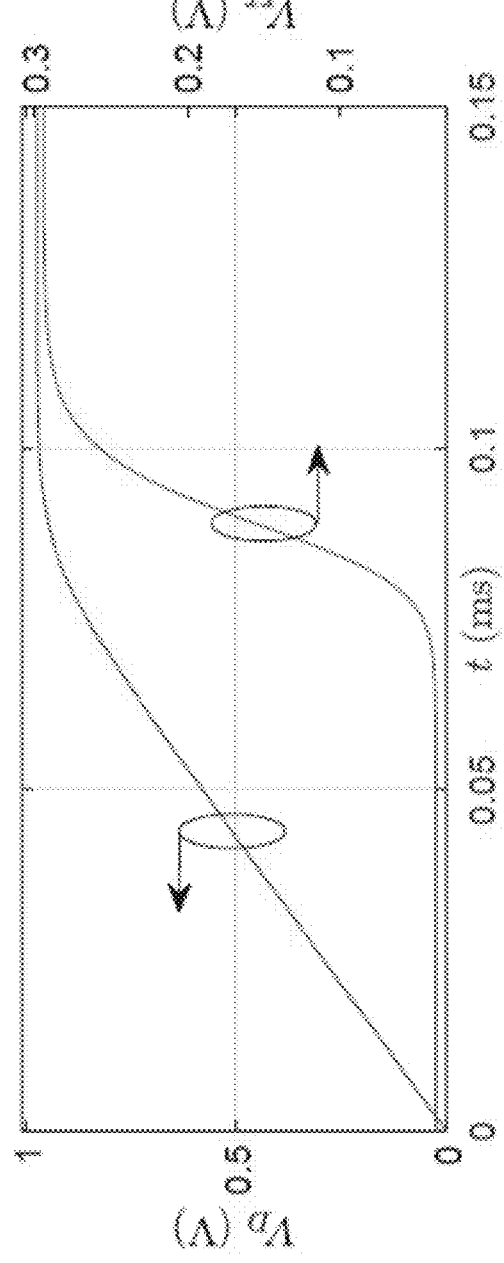
FIG. 10 illustrates voltage across a solar cell and output voltage of optical receiver as the solar cell's internal capacitance charges up.

FIG. 9 shows the measured waveform and the numerical solution for the solar cell's voltage for an initial condition of $V_D$=0 V (SC) and for $I_{ph}$=8.2 mA, $R_{sh}$=6.57 kΩ and $C_j$=700 nF. Notably, $V_D$ increases steadily, as the internal junction capacitance charges up, until it reaches the OC voltage ($V_{oc}$=0.964 V). FIG. 10 illustrates voltage across the solar cell, $V_D$, and output voltage of optical receiver, $V_{rx}$, as the solar cell's internal capacitance charges up from SC.

The output of the receiver's amplifier, $V_{rx}$, is a linear function of the photo-current $I_{ph}$ and can be calculated as follows:

$$V_{rx} = I_{ph} \times R_f \times G \quad (5)$$

where, $R_f$ is the feedback resistor and G is the gain of the second stage of the amplifier. Moreover, $I_{ph}=P_{rx}R_\lambda$, where $P_{rx}$ is power received by the optical receiver and $R_\lambda$ is responsivity of the receiver's photo-diode. $P_{rx}$ can be estimated from the irradiance using:

$$P_{rx} = A_{lens} \times E_{pl} \quad (6)$$

where, $A_{lens}$ is the area of the receiver's lens. Combining the solution of (4) with (3), (5) and (6), the receiver's output $V_{rx}$ was estimated and is shown in FIG. 3 (for $R_f$=100 kΩ, G=10, $A_{lens}$=5.07 cm$^2$ and $R_\lambda$=0.68 A/W). This result matches well with the acquired waveforms shown in FIG. 7 and it also shows that $V_{rx}$ starts to rise only after $V_D$ has risen above 0.835 V or about 86% of $V_{oc}$. This delayed response in $V_{rx}$ is due to the non-linear and exponential relationship between the emitted PL and $V_D$. It also suggests that an improved PL modulator does not need to fully short circuit the solar cell to significantly change the solar cell's PL.

The functionality of the modulator was also verified experimentally using the test setup shown in FIG. 6 in which the on-off modulator was replaced with the proposed modulator. The proposed modulator was implemented using the NTS4409 MOSFET and the low-power TLV2761 opamp, which has a supply current consumption of 20 μA.

Figure 11:
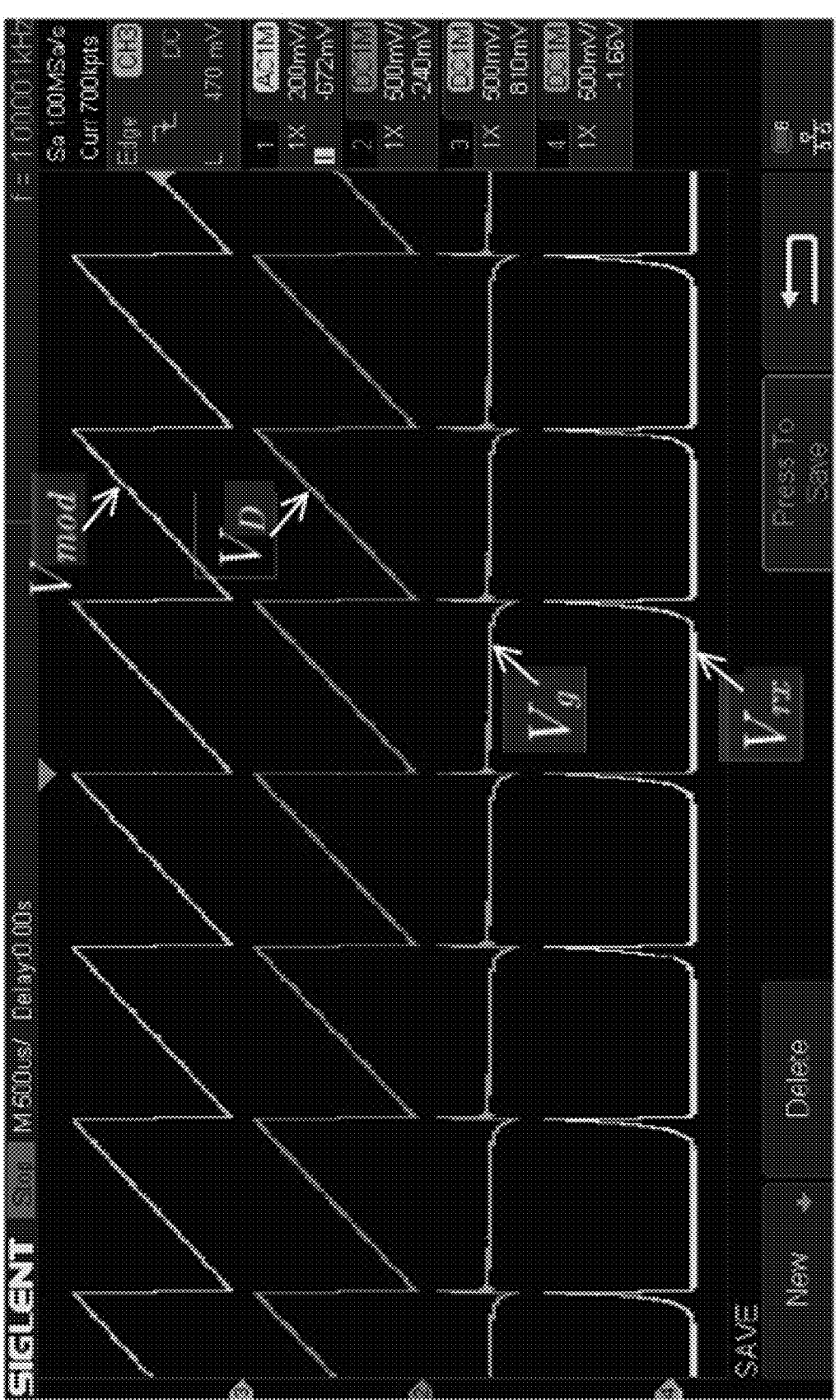
FIG. 11 illustrates acquired waveforms when a system for modulating PL transmission from a solar cell was used to modulate the solar cell voltage with a ramp waveform.

FIG. 11 shows acquired waveforms that demonstrate the expected operation of the modulator and validate the circuit analysis presented above. The figure also shows an exponential rise at $V_{rx}$ corroborating the exponential relationship between $V_D$ and solar cell's luminescent optical power.

Due to this exponential relationship, the receiver's output, $V_{rx}$, does not rise until $V_D$ is sufficiently high. To establish the modulation amplitude that results in the fastest response for binary pulse modulation, the following experiment was carried out: $V_D$ was modulated with a square pulse, with a voltage excursion from $V_{low}$ to $V_{oc}$, and the receiver output $V_{rx}$ was recorded.

Figure 12:
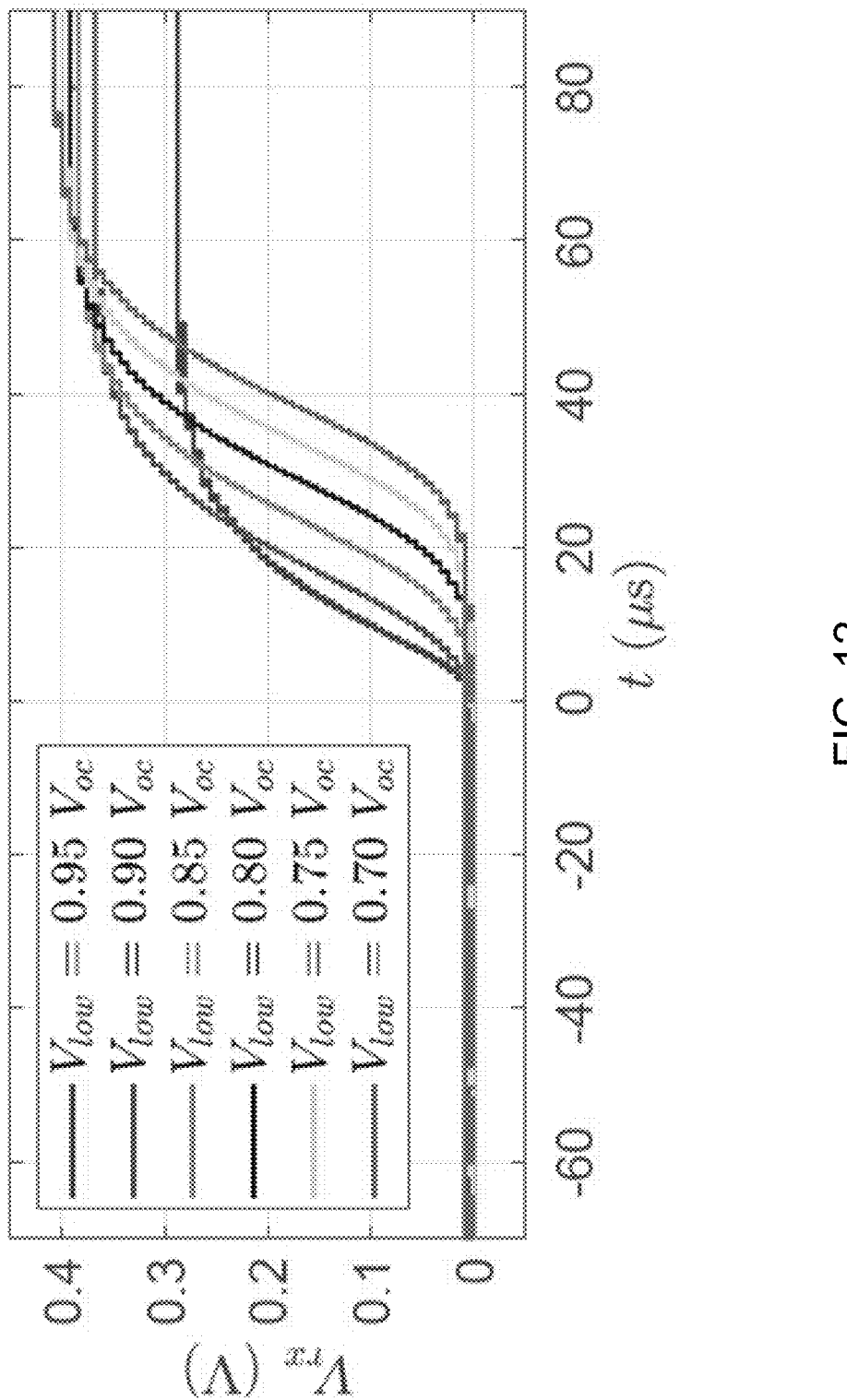
FIG. 12 illustrates acquired waveforms at the output of the optical receiver as is modulated with a square pulse with voltage excursion.

FIG. 12 illustrates acquired waveforms at the output of the optical receiver as $V_D$ is modulated with a square pulse with voltage excursion from Vlow to Voc. FIG. 12 shows the results of this experiment for different values of $V_{low}$. It can be seen that as $V_{low}$ decreases, it takes longer for $V_{rx}$ to start rising. On the other hand, if $V_{low}$ is too high, i.e. 0.95 $V_{oc}$, the output pulse's amplitude decreases. A good compromise is to set $V_{low}$ to 0.85 $V_{oc}$ or 0.90 $V_{oc}$. In practice, $V_{oc}$ is measured periodically as part of most maximum power point tracking algorithms.

Figure 13:
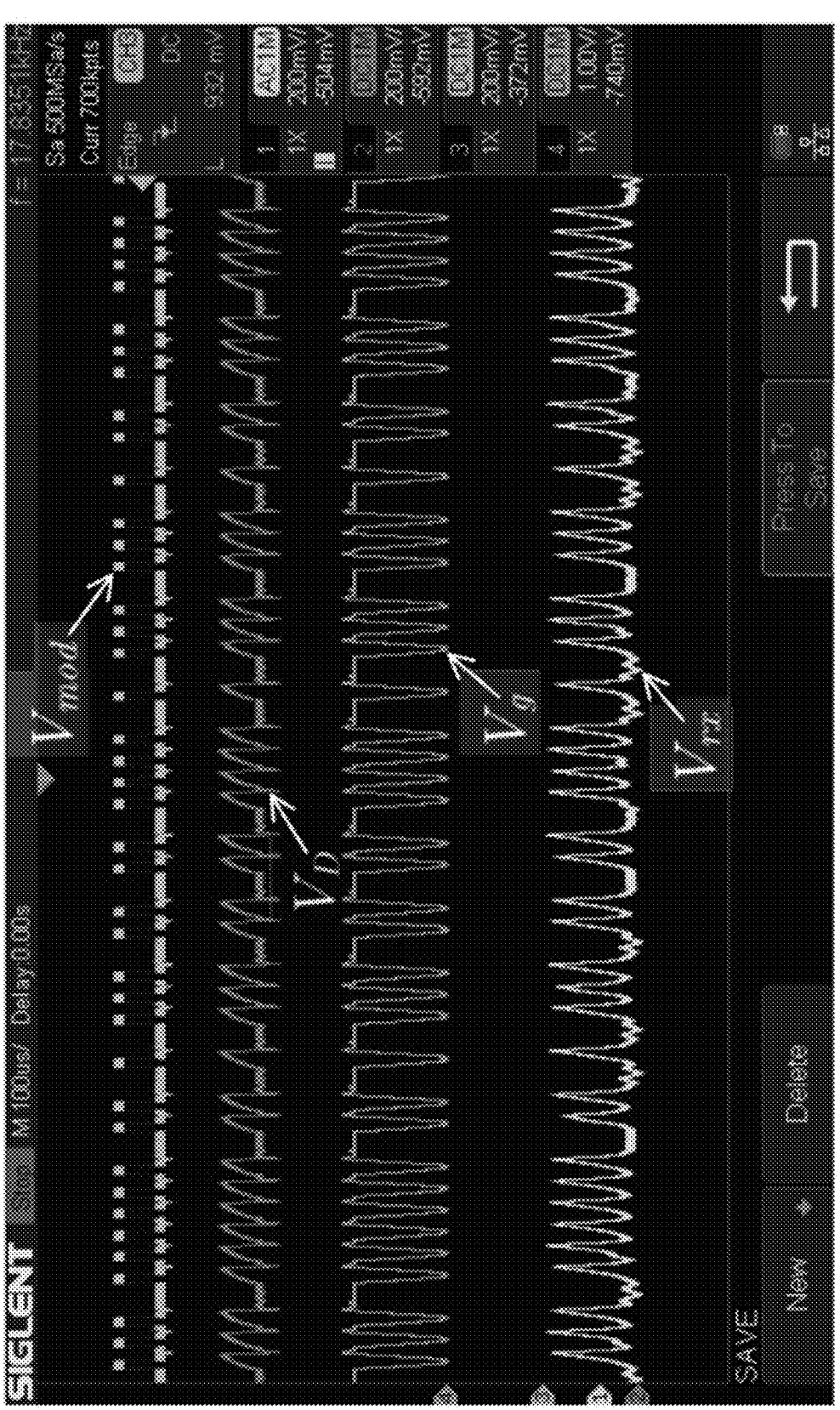
FIG. 13 illustrates acquired waveforms from a PL-based optical communication system that uses a system for modulating PL transmission.

As a final test, the solar cell's luminescence was modulated with a random sequence of bits to assess the performance of a PL-based optical communication link using the proposed modulator. For this test, a binary differential pulse interval modulation (DPIM) scheme was employed as it has been shown to be advantageous for optical communications. In this scheme, the 0 symbol was represented by a pulse of width $T_p$ followed by a quite period of $T_0$ seconds while the 1 symbol was represented by a pulse of width $T_p$ followed by a quite period of $T_1$ seconds. For this test the proposed modulator circuit was employed with the test setup of FIG. 6. FIG. 13 shows waveforms acquired from the modulator as bits were transmitted for $V_{low}$=0.90 $V_{oc}$, $T_p$=10 μs, $T_0$=15 μs and $T_1$=40 μs. A measured bit error rate (BER) of 7.71×10$^{-6}$ for 388,874 transmitted bits was obtained at a rate of 26.67 kbps.

A second action may be said to be "in response to" a first action independent of whether the second action results directly or indirectly from the first action. The second action may occur at a substantially later time than the first action and still be in response to the first action. Similarly, the second action may be said to be in response to the first action even if intervening actions take place between the first action and the second action, and even if one or more of the intervening actions directly cause the second action to be performed. For example, a second action may be in response to a first action if the first action sets a flag and a third action later initiates the second action whenever the flag is set.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

While various embodiments have been described, it will be apparent to those of ordinary skill in the art that many more embodiments and implementations are possible. Accordingly, the embodiments described herein are examples, not the only possible embodiments and implementations.

What is claimed is:

1. A system comprising:
a solar cell;
a modulator connected to an output of the solar cell; and an input configured to receive a signal, wherein the signal being in a first state causes the modulator to modulate voltage output of the solar cell and cause the solar cell to perform optical transmission, the signal being in a second state causes the modulator to cease modulation of the output of the solar cell, and
wherein the modulator comprises a transistor and an op-amp in a feedback loop configuration.

2. The system of claim 1, further comprising a first switch controlled by the signal, the first switch selectively connecting the op-amp to either a modulation voltage or a voltage higher than the open contact voltage of the op-amp, wherein the signal being in the first state connects the op-amp to a modulation voltage, wherein the signal being in the second state connects the op-amp to a voltage higher than the open contact voltage of the op-amp.

3. The system of claim 2, further comprising a second switch controlled by the signal, the select switch selectively connecting the output of the solar cell to a DC to DC converter, wherein the signal being in the first state disconnects the output of the solar cell from the DC to DC converter, wherein the signal being in the second state connects the output of the solar cell to the DC to DC converter.

4. The system of claim 3, wherein the voltage higher than the open contact voltage of the op-ap is provided by the output of the DC to DC converter.

5. The system of claim 1, wherein the transistor is a metal-oxide-semiconductor field-effect transistor.

6. The system of claim 1, further comparing an optical receiver, wherein the optical receiver is configured to receive the optical transmission from the solar cell.

7. The system of claim 1, wherein the solar cell is a Gallium arsenide (GaAs) solar cell.

* * * * *